(12) United States Patent
Nishizawa

(10) Patent No.: US 7,709,293 B2
(45) Date of Patent: May 4, 2010

(54) SEMICONDUCTOR DEVICE AND MANUFACTURING METHOD OF THE SEMICONDUCTOR DEVICE

(75) Inventor: Motoyuki Nishizawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 110 days.

(21) Appl. No.: 12/038,444

(22) Filed: Feb. 27, 2008

(65) Prior Publication Data
US 2008/0211095 A1 Sep. 4, 2008

(30) Foreign Application Priority Data
Mar. 2, 2007 (JP) .............................. 2007-052788

(51) Int. Cl.
*H01L 21/00* (2006.01)
(52) U.S. Cl. .................. 438/108; 438/106; 438/118
(58) Field of Classification Search ................ 438/106, 438/108, 118
See application file for complete search history.

(56) References Cited

U.S. PATENT DOCUMENTS

| | | | | |
|---|---|---|---|---|
| 5,844,320 | A * | 12/1998 | Ono et al. ................... | 257/778 |
| 6,103,551 | A * | 8/2000 | Ono et al. ................... | 438/108 |
| 6,137,184 | A * | 10/2000 | Ikegami ..................... | 257/785 |
| 6,251,211 | B1 * | 6/2001 | Lake .......................... | 156/273.3 |
| 6,452,280 | B1 * | 9/2002 | Shiraishi et al. ............. | 257/778 |
| 6,651,320 | B1 * | 11/2003 | Yagi et al. .................... | 29/840 |
| 6,781,247 | B2 * | 8/2004 | Shibata ........................ | 257/781 |
| 6,791,839 | B2 * | 9/2004 | Bhagwagar ................... | 361/705 |
| 6,808,958 | B2 * | 10/2004 | Light ........................... | 438/106 |
| 6,940,024 | B2 * | 9/2005 | Watanabe .................... | 174/261 |
| 7,145,250 | B2 * | 12/2006 | Maruyama et al. .......... | 257/778 |
| 2003/0015349 | A1 * | 1/2003 | Watanabe .................... | 174/261 |
| 2004/0150118 | A1 * | 8/2004 | Honda .......................... | 257/778 |
| 2008/0211095 | A1 * | 9/2008 | Nishizawa .................... | 257/746 |

FOREIGN PATENT DOCUMENTS

| JP | 2002-203868 A | 7/2002 |
|---|---|---|
| JP | 2002-353265 A | 12/2002 |
| JP | 3409957 B2 | 5/2003 |
| JP | 2008218643 A * | 9/2008 |

OTHER PUBLICATIONS

Korean Office Action dated Aug. 31, 2009 (mailing date), issued in corresponding Korean Patent Application No. 10-2008-0018757.

* cited by examiner

*Primary Examiner*—Laura M Menz
(74) *Attorney, Agent, or Firm*—Westerman, Hattori, Daniels & Adrian, LLP

(57) ABSTRACT

A semiconductor device where an outside connection terminal of a semiconductor element and an electrode of a wiring board are connected to each other via a conductive adhesive, the conductive adhesive includes a first conductive adhesive; and a second conductive adhesive covering the first conductive adhesive; wherein the first conductive adhesive contains a conductive filler including silver (Ag); and the second conductive adhesive contains a conductive filler including a metal selected from a group consisting of tin (Sn), zinc (Zn), cobalt (Co), iron (Fe), palladium (Pd), and platinum (Pt).

12 Claims, 9 Drawing Sheets

SEMICONDUCTOR DEVICE AND MANUFACTURING METHOD OF THE SEMICONDUCTOR DEVICE

TECHNICAL FIELD

The present invention generally relates to semiconductor devices and manufacturing methods of the semiconductor devices.

BACKGROUND

As electronic devices such as mobile phones or digital cameras have high functionality and small sizes, higher functions and higher integration are in demand for semiconductor devices provided in the electronic devices. Accordingly, recently, a semiconductor element such as a integrated circuit chip being directly mounted on a wiring board has been suggested so that the mounting area is made small and efficient use is achieved.

More specifically, in the semiconductor device, a semiconductor integrated circuit element (hereinafter "semiconductor element") is mounted on a wiring board by using convex (projection) outside connection terminals called wire bumps. Insulating resin such as glass epoxy resin is used for a base part of the wiring board. Conductive layers made of copper (Cu) or the like are selectively provided on a main surface of the wiring board. The convex (projection) outside connection terminals provided on a main surface of the semiconductor element are connected to the conductive layers of the wiring board. Outside connection terminals such as spherical electrode terminals are provided on surfaces of electrodes selectively formed on another main surface of the wiring board. In the above-mentioned semiconductor device, the semiconductor element is mounted on the wiring board in a so-called flip-chip (face-down) state. The above-mentioned flip-chip mounting structure is formed by the following methods.

In a first method, when a semiconductor element is mounted on a wiring board, an underfill material such as a thermosetting adhesive is supplied on a main surface of the wiring board in advance. While the semiconductor element is mounted on the wiring board via the underfill by applying high loads so that the underfill material is spread, the underfill material is made to flow across in the entire surface area of the semiconductor element by capillary action. At the same time, the underfill material is cured by heat applied at the time when the semiconductor element is mounted.

In the first method, since the high loads are applied to the semiconductor at the same time that the underfill material is cured, the convex shaped outside connection terminal of the semiconductor element and the electrode of the wiring board are crushed against each other so as to be connected to each other.

In this pressure connecting type first method, connection of the convex shaped outside connection terminal of the semiconductor element and the electrode of the wiring board is maintained by using a contractive force for curing the underfill material by heat and a repulsive force when the convex shaped outside connection terminal of the semiconductor element is crushed, so as to make electric connection between the convex shaped outside connection terminal of the semiconductor element and the electrode of the wiring board.

In a second method, a conductive adhesive made of, for example, silver (Ag) paste is transferred to the head end of the convex shaped outside connection terminal. The convex shaped outside connection terminal of the semiconductor device and the electrode of the wiring board are connected to each other via the conductive adhesive. Then, an underfill material is applied in the vicinity of the external circumference of the semiconductor element on the wiring board. The underfill material is made to flow across the entire surface area of the semiconductor element by capillary action and is cured by heating.

It is general practice to use, as the above-mentioned conductive adhesive, silver (Ag) or a mixture or an alloy containing silver (Ag) as a main ingredient. Silver (Ag) has a low volume resistivity and low contact resistance with gold (Au) forming the convex shaped outside connection terminal of the semiconductor element.

Japanese Patent No. 3409957 describes an example where two kinds of conductive adhesives are used for a connecting part of an electrode of a wiring board and an electrode of a semiconductor element. More specifically, a structure of a projection electrode of an IC chip mounted on the wiring board in a face-down manner is suggested in Japanese Patent No. 3409957. A first conductive adhesive made of a conductive filler of silver palladium (AgPd) is transferred to the projection electrode and a second conductive adhesive made of a conductive filler of silver (Ag) is transferred to the outside of the first conductive adhesive. A thin semiconductor device having good electric properties can be easily formed by flip chip mounting using such a method.

However, as the semiconductor device has high level functions, the pitch of the convex shaped outside connection terminals becomes narrow so that the size of the convex shaped outside connection terminals become small.

In this pressure connecting type first method, high loads are applied to the semiconductor element at the same time when the underfill material is cured so that the convex shaped outside connection terminal of the semiconductor element is crushed. However, since the semiconductor element is more solid than the wiring board, a curve whose top part is situated substantially in the center of the wiring board may be formed in the wiring board where the semiconductor element is flip-chip mounted. As a result of this, a gap in a vertical direction between the semiconductor element and the wiring board becomes narrow in an area other than an area where electric connection of the semiconductor element and the wiring board is formed by the electrode and the convex shaped outside connection terminal becomes narrow.

Because of this, a particle generated during a manufacturing process of the semiconductor device enters in the underfill material positioned in the gap in the vertical direction between the semiconductor element and the wiring board so that a circuit of the semiconductor element may be broken.

If the load applied when the semiconductor element and the wiring board are connected to each other so that the gap in the vertical direction between the semiconductor element and the wiring board is made wide, a force for connecting the convex shaped outside connection terminal of the semiconductor device and the electrode of the wiring board may be degraded so that shorts between the semiconductor element and the wiring board may be generated. In other words, if the pressure connecting type first method is applied to flip chip mounting of the semiconductor element where the convex shaped outside connection terminals are formed with a narrow pitch on the wiring board, a connection limit may be generated where the connection between the semiconductor element and the wiring board is released.

In addition, in a case where a test having a heat history such as a reflow test or a temperature cycle test is performed, due to stress caused by thermal expansion based on differences of thermal expansion coefficients of the semiconductor elements, the wiring board, the underfill material, the conductive adhesive, and others, the connection of the semiconductor element and the wiring board may become loose and a short between the semiconductor element and the wiring board may be generated.

In the above-discussed second method, the semiconductor element, where the conductive adhesive of silver (Ag) paste is transferred on the head end of the convex shaped outside connection terminal, is mounted on the wiring board so that the convex shaped outside connection terminal of the semiconductor element and the electrode of the wiring board are connected to each other. Accordingly, a connection part where the convex shaped outside connection terminal of the semiconductor element and the electrode of the wiring board are connected to each other is a low elasticity body.

Accordingly, in a case where the test having a heat history such as a reflow test or a temperature cycle test is performed, although the connection between the semiconductor element and the wing board is not loosened, ion migration, where silver (Ag) contained in the conductive adhesive is ionized due to an electric field or environment and eluted in the periphery, may be easily generated. In particular, if the pitch of the convex shaped outside connection terminals becomes narrow and a large amount of silver (Ag) exists in the connection part where the convex shaped outside connection terminals of the semiconductor element and the electrodes of the wiring board are connected to each other, the shorts due to the ion migration between the semiconductor element and the wiring board may be easily generated.

Furthermore, in the example discussed in Japanese Patent No. 3409957, since the second conductive adhesive made of silver (Ag) conductive filler is formed on the outermost circumferential part of the projection electrodes, it is difficult to avoid generation of the above-mentioned silver ion migration.

SUMMARY

One aspect of the present invention may be to provide a semiconductor device where an outside connection terminal of a semiconductor element and an electrode of a wiring board are connected to each other via a conductive adhesive, the conductive adhesive including a first conductive adhesive; and a second conductive adhesive covering the first conductive adhesive; wherein the first conductive adhesive contains a conductive filler including silver (Ag); and the second conductive adhesive contains a conductive filler including a metal selected from a group consisting of tin (Sn), zinc (Zn), cobalt (Co), iron (Fe), palladium (Pd), and platinum (Pt).

Another aspect of the present invention may be to provide a manufacturing method of a semiconductor device, the semiconductor device including an outside connection terminal of a semiconductor element and an electrode of a wiring board that are connected to each other via a conductive adhesive, the manufacturing method including a step of forming a first conductive adhesive containing a conductive filler including silver (Ag) on the outside connection terminal of the semiconductor element; a step of forming a second conductive adhesive on a surface of the first conductive adhesive, the second conductive adhesive containing a conductive filler including a metal selected from a group consisting of tin (Sn), zinc (Zn), cobalt (Co), iron (Fe), palladium (Pd), and platinum (Pt); and a step of connecting the outside connection terminal of the semiconductor element to the electrode formed on the wiring board.

DETAILED DESCRIPTION OF THE EMBODIMENTS

A description is given below, with reference to the FIG. 1 through FIG. 10 of embodiments of the present invention.

For the convenience of explanation, a structure of a semiconductor device of an embodiment of the present invention is discussed and then a manufacturing method of the semiconductor device is discussed.

[Semiconductor Device]

Figure 1:
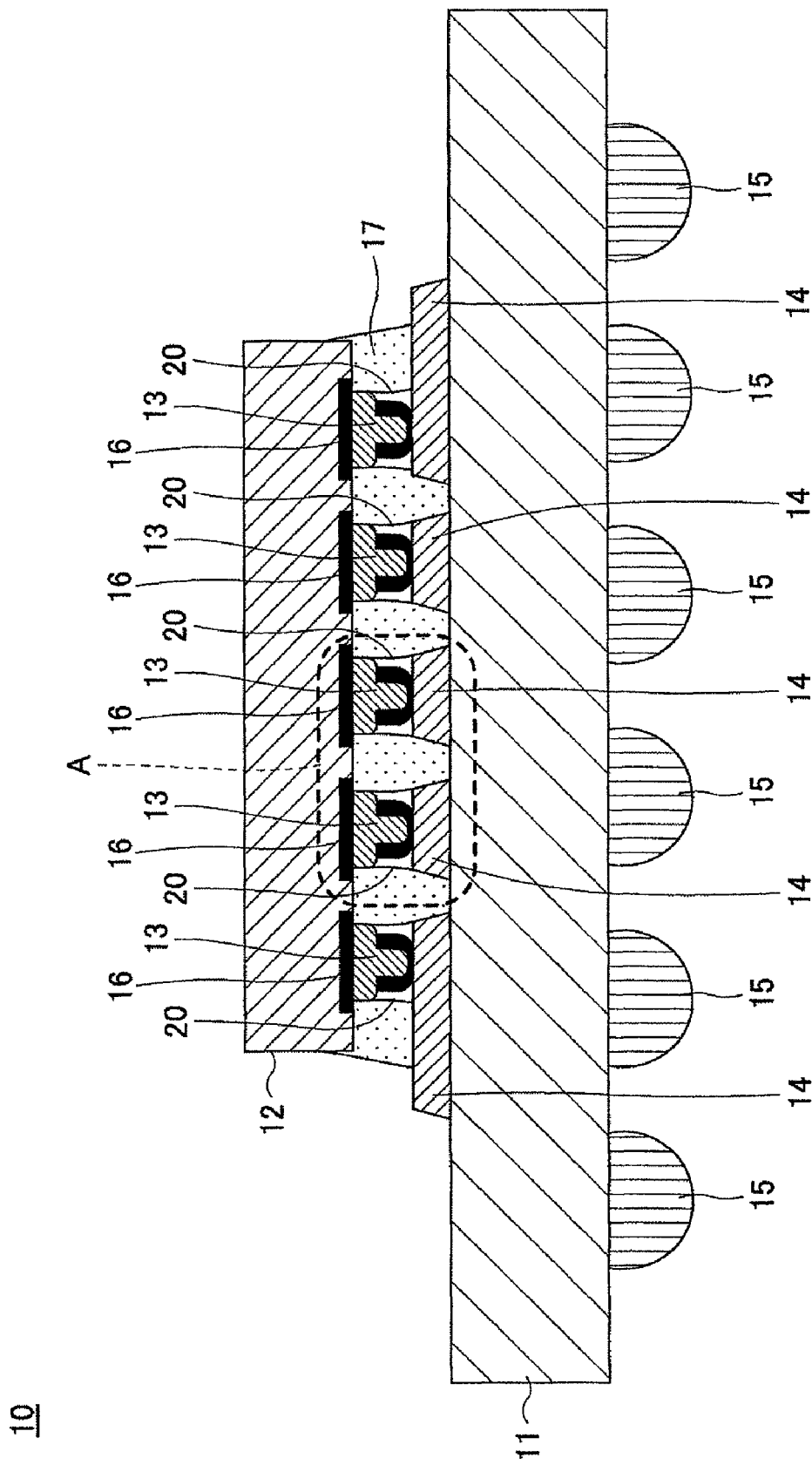
FIG. 1 is a cross-sectional view of a semiconductor device of an embodiment of the present invention.

FIG. 1 is a cross-sectional view of a semiconductor device of an embodiment of the present invention.

Referring to FIG. 1, in a semiconductor device 10, a semiconductor integrated circuit element (hereinafter "semiconductor element") 12 is mounted and fixed on one of main surfaces of a wiring board 11 in a so-called flip-chip (face-down) state.

The wiring board 11 is made of an organic resin material such as glass-epoxy, glass-BT (bismaleimide-triazine), or polyimide, or an inorganic material such as ceramic or glass. The wiring pattern not shown in FIG. 1 and made of copper (Cu) or the like is selectively provided on the wiring board 11. The wiring board 11 may be called an interposer or a supporting board.

Bonding electrodes 14, where the convex (projection) shaped outside connection terminals 13 of the semiconductor element 12 mounted on the wiring board 11 are connected, are formed on the main surface of the wiring board 11 where the semiconductor element 12 is mounted. The bonding electrode 14 is made of, for example, copper (Cu), nickel (Ni), or gold (Au).

A conductive layer not shown in FIG. 1 is provided on another main surface of the wiring board 11 situated at a side opposite to the surface where the semiconductor element 12 is mounted. Plural outside connection terminals 15 such as spherical shaped electrode terminals made of solder or the like are provided on the conductive layer in a grid pattern.

The semiconductor element 12 includes a silicon (Si) semiconductor substrate and is formed by a known semiconductor manufacturing process. The present invention can be applied to a semiconductor device having a semiconductor element made of a chemical semiconductor such as gallium arsenide (GaAs).

Outside connection terminal pads 16 are selectively provided in a line on the main surface of the semiconductor substrate 12. For example, the outside connection terminal pads 16 are provided along four side in the vicinity of the four sides of the main surface of the semiconductor substrate 12 or along two sides in the vicinity of the two sides facing each other of the main surface of the semiconductor substrate 12. The convex (projection) shaped outside connection terminals 13 called wire bumps are provided on the outside connection terminal pads 16.

The outside connection terminal pads 16 are made of aluminum (Al), copper (Cu), or an alloy of these metals. A gold (Au) layer may be formed on an exposed surface (top layer) of the outside connection terminal pads 16 by an electrolytic plating method, a vapor deposition method, or the like.

In addition, the convex (projection) shaped outside connection terminal 13 provided on each of the outside connection terminal pads 16 is formed by, for example, a so-called ball bonding method using a wire bonding technique. More specifically, a seating part is formed by pressure fixing or connecting a gold (Au) ball and a projection part projecting from the seating part so that the convex (projection) shaped outside connection terminal 13 is formed.

The convex (projection) shaped outside connection terminal 13 is not limited to the above-mentioned example. For example, the convex (projection) shaped outside connection terminal 13 may be made of copper (Cu), an alloy of copper (Cu) and gold (Au), solder, or the like.

As discussed above, while the convex shaped outside connection terminal 13 of the semiconductor element 12 are connected to the corresponding bonding electrodes 14 of the wiring board 11, the conductive adhesive 20 is provided on the convex shaped outside connection terminals 13. At least the projection parts of the convex shaped outside connection terminals 13 of the semiconductor element 12 and the bonding electrodes 14 corresponding to these are commonly covered with the conductive adhesive 20 so that the convex shaped outside connection terminals 13 and the bonding electrodes 14 are mechanically and electrically connected to each other.

Figure 2:
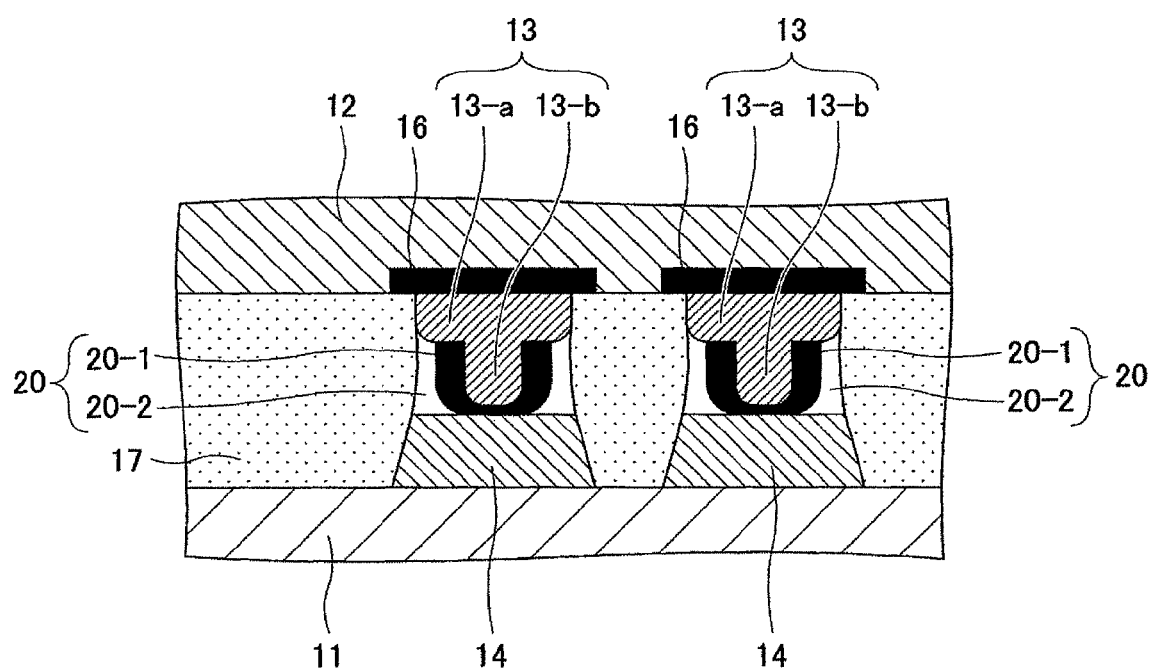
FIG. 2 is an expanded view of a part surrounded by a dotted line A of FIG. 1.

Here, an arrangement structure of the conductive adhesive 20 is discussed with reference to FIG. 2. FIG. 2 is an expanded view of a part surrounded by a dotted line A of FIG. 1.

As shown in FIG. 2, the conductive adhesive 20 has a two-layer structure formed by a first conductive adhesive 20-1 and a second conductive adhesive 20-2. More specifically, a layer made of the first conductive adhesive 20-1 is provided around a projection part 13-$b$ positioned on a seating part 13-$a$ of the convex shaped outside connection terminal 13. The second conductive adhesive 20-2 is formed outside the first conductive adhesive 20-1 so as to cover the external surface of the first conductive adhesive 20-1.

The first conductive adhesive 20-1 and the second conductive adhesive 20-2 are adhesives containing metal particles as conductive fillers that are dispersed in binder resin and an organic solvent. As the binder resin, examples include an epoxy composition, an acrylic composition, a vinyl composition, a thermosetting composition such as a composition where a hydroxyl group is provided at an end, a resin composition soluble in a solvent, a mixture of them, or the like. In the epoxy resin as the binder resin, an epoxy based compound as epoxy curing agent is an essential ingredient and a surface active agent or flux may be applied.

As the first conductive adhesive 20-1, an adhesive may be used where silver (Ag) or a mixture (intermetallic compound) or an alloy whose main ingredient is silver (Ag) is dispersed as a conductive filler in the above-mentioned binder resin. Silver (Ag) has a low volume resistivity and low contact resistance with gold (Au) forming the convex shaped outside connection terminal 13 of the semiconductor element 12. Silver palladium (AgPd), for example, can be used as a mixture (intermetallic compound) or alloy whose main ingredient is silver (Ag). For example, an adhesive where 30 wt % or more of silver (Ag) particles having 1 μm or less of an average grain diameter are dispersed in the binder resin can be used as the first conductive adhesive 20-1.

As the second conductive adhesive 20-2, an adhesive can be used where tin (Sn) or mixture (intermetallic compound) or an alloy whose main ingredient is tin (Sn) is dispersed as a conductive filler in the above-mentioned binder resin. For example, an adhesive where 30 wt % or more of tin (Sn) particles having 0.1 μm or less average grain diameter are dispersed in the binder resin can be used as the second conductive adhesive 20-2.

Since in the second conductive adhesive 20-2, an adhesive where tin (Sn) or a mixture (intermetallic compound) or an alloy whose main ingredient is tin (Sn) is dispersed as a conductive filler in the above-mentioned binder resin, due to heat applied when the convex shaped outside connection terminals 13 of the semiconductor element 12 are connected to the bonding electrodes 14 of the wiring board 11, the second conductive adhesive 20-2 takes oxygen ($O_2$) in from the environment so that a thin oxide film is formed on an external surface of the second conductive adhesive 20-2.

In other words, the conductive adhesive 20 configured to connect the convex shaped outside connection terminals 13 of the semiconductor element 12 and the bonding electrodes 14 of the wiring board 11 has a two-layer structure formed by the first conductive adhesive 20-1 and the second conductive adhesive 20-2. Accordingly, even if silver (Ag) or silver contained in the mixture (intermetallic compound) or an alloy whose main ingredient is silver (Ag) is eluted as ions, by the oxide film of tin (Sn) formed on the external surface of the second conductive adhesive 20-2, it is possible to prevent hydroxide ions ($OH^-$) supplied from the wiring board 11 or the underfill material 17 from being taken into the first conductive adhesive 20-1 too much.

Accordingly, in this example, as compared to a case such as that discussed in Japanese Patent No. 3409957, where silver (Ag) is formed on the outermost external circumferential part of the convex shaped outside connection terminal of the semiconductor element, it is possible to reduce ratios of a case where silver ions ($Ag^+$) and hydroxide ions ($OH^-$) are associated with each other. Hence, it is possible to prevent dendrite formation causing the ion migration and prevent shorts between the semiconductor element 12 and the wiring board 11 due to ion migration of silver (Ag).

In the above-discussed example, an adhesive where tin (Sn) or a mixture (intermetallic compound) or an alloy whose main ingredient is tin (Sn) is dispersed as a conductive filler in the binder resin is used as the second conductive adhesive 20-2. However, the present invention is not limited to this.

An adhesive where 30 wt % or more of, for example, zinc (Zn), cobalt (Co), iron (Fe), palladium (Pd), platinum (Pt), or an alloy including these metals, instead of tin (Sn) or a mixture (intermetallic compound) or an alloy whose main ingredient is tin (Sn), is dispersed in the binder resin may be used as the second conductive adhesive 20-2. In this case, it is possible to achieve the same effect as that explained in the above discussed example.

In the meantime, in the conductive adhesive 20 having a two-layer structure formed by the first conductive adhesive 20-1 and the second conductive adhesive 20-2, the second conductive adhesive 20-2 is formed outside the first conductive adhesive 20-1 so as to cover the external circumferential surface of the first conductive adhesive 20-1. The first conductive adhesive 20-1 is exposed on the surface where the conductive adhesive 20 is connected to the bonding electrodes 14 of the wiring board 11.

This structure is discussed with reference to FIG. 3. Here, FIG. 3 is a view of a conductive adhesive 20 (shown in FIG. 2) seen from an upper surface side of the bonding electrode 14, namely from a side of a surface where the bonding electrode 14 is connected to the conductive adhesive 20.

Figure 3:
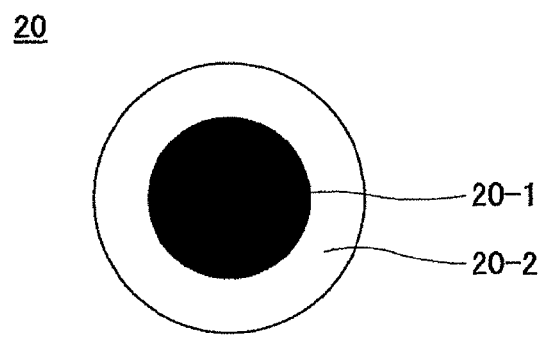
FIG. 3 is a view of a conductive adhesive (shown in FIG. 2) seen from an upper surface side of a bonding electrode.
Figure 4:
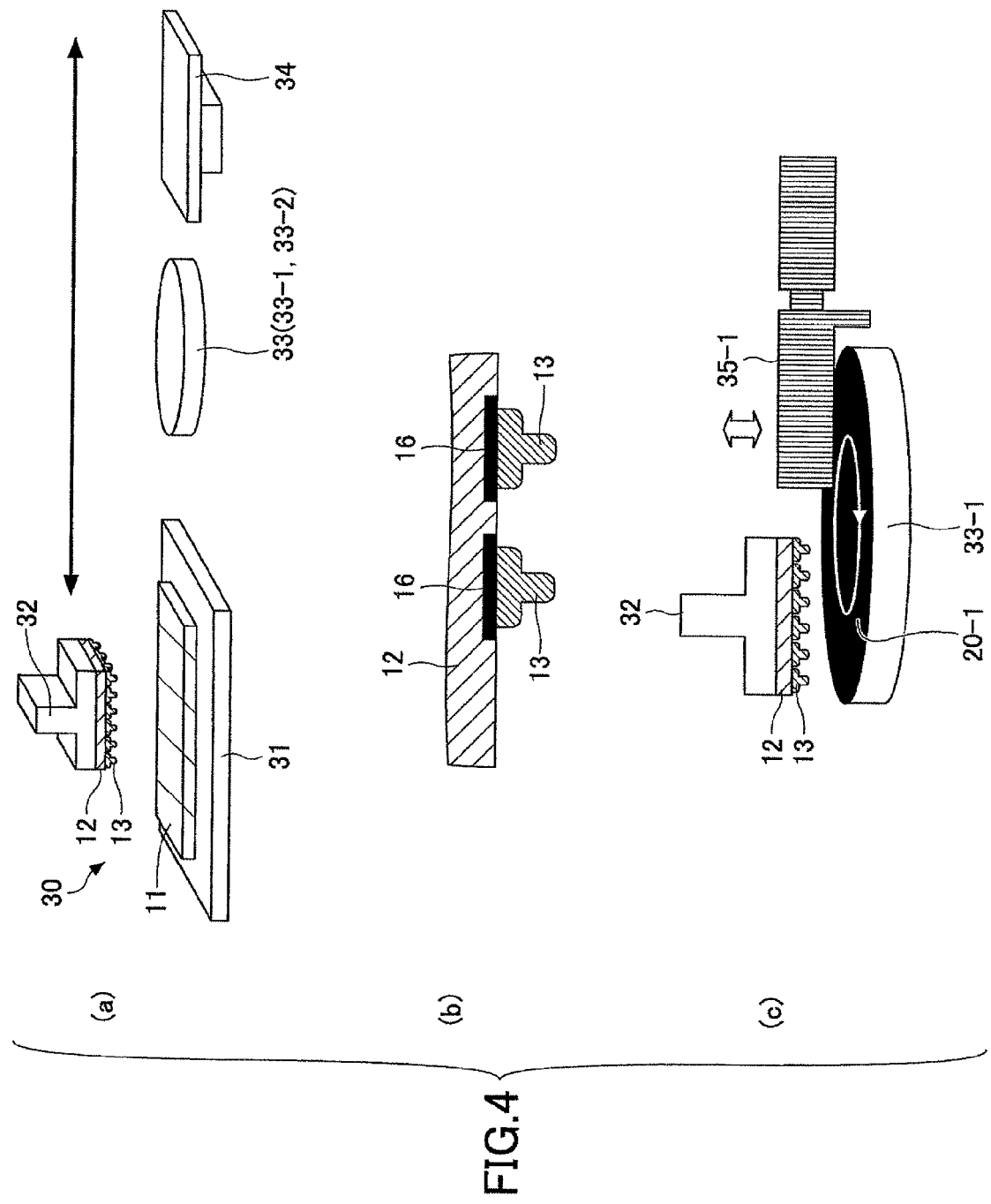
FIG. 4 is a first view of a first manufacturing method of the semiconductor device of the embodiment of the present invention.
Figure 5:
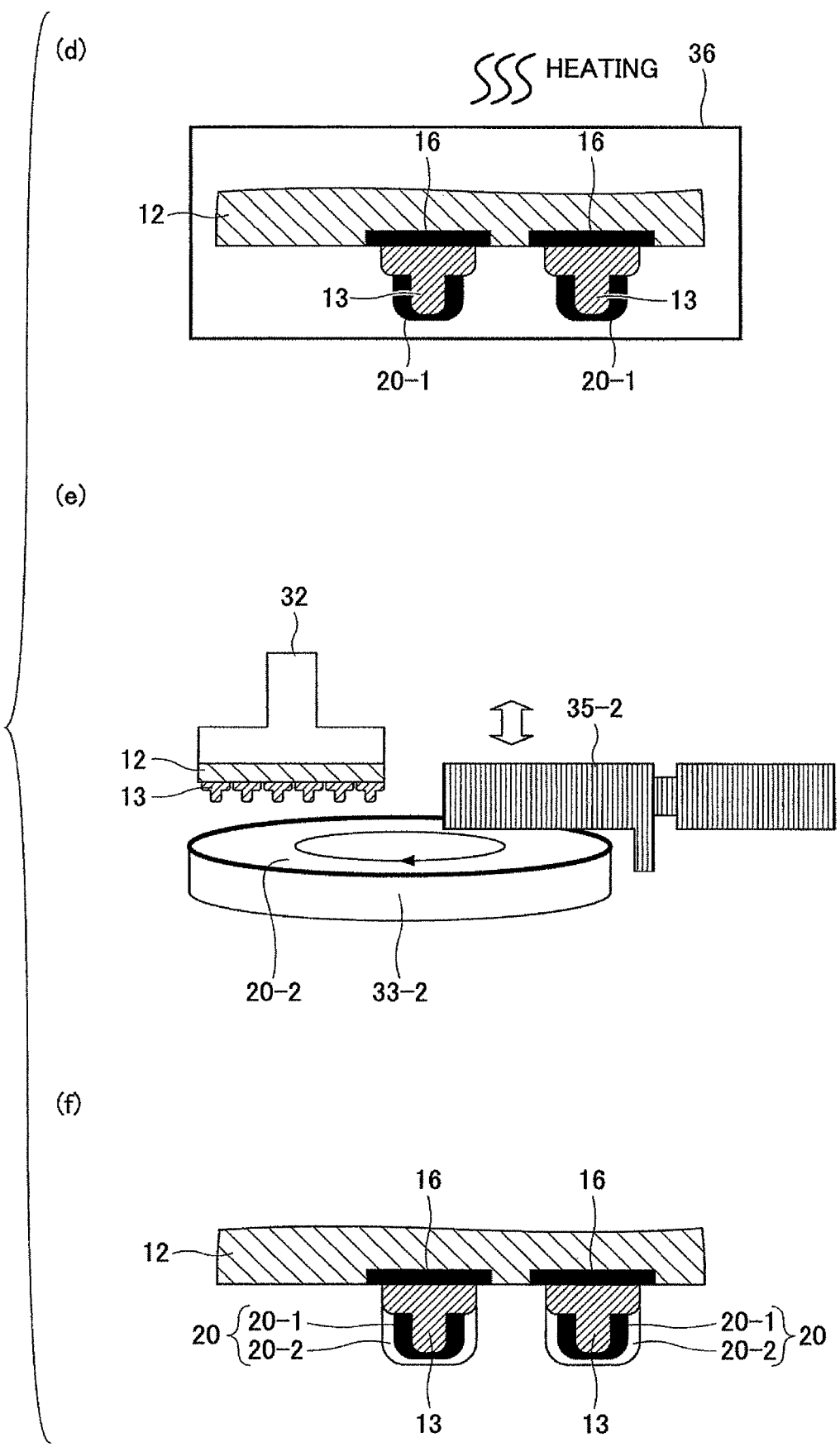
FIG. 5 is a second view of the first manufacturing method of the semiconductor device of the embodiment of the present invention.
Figure 6:
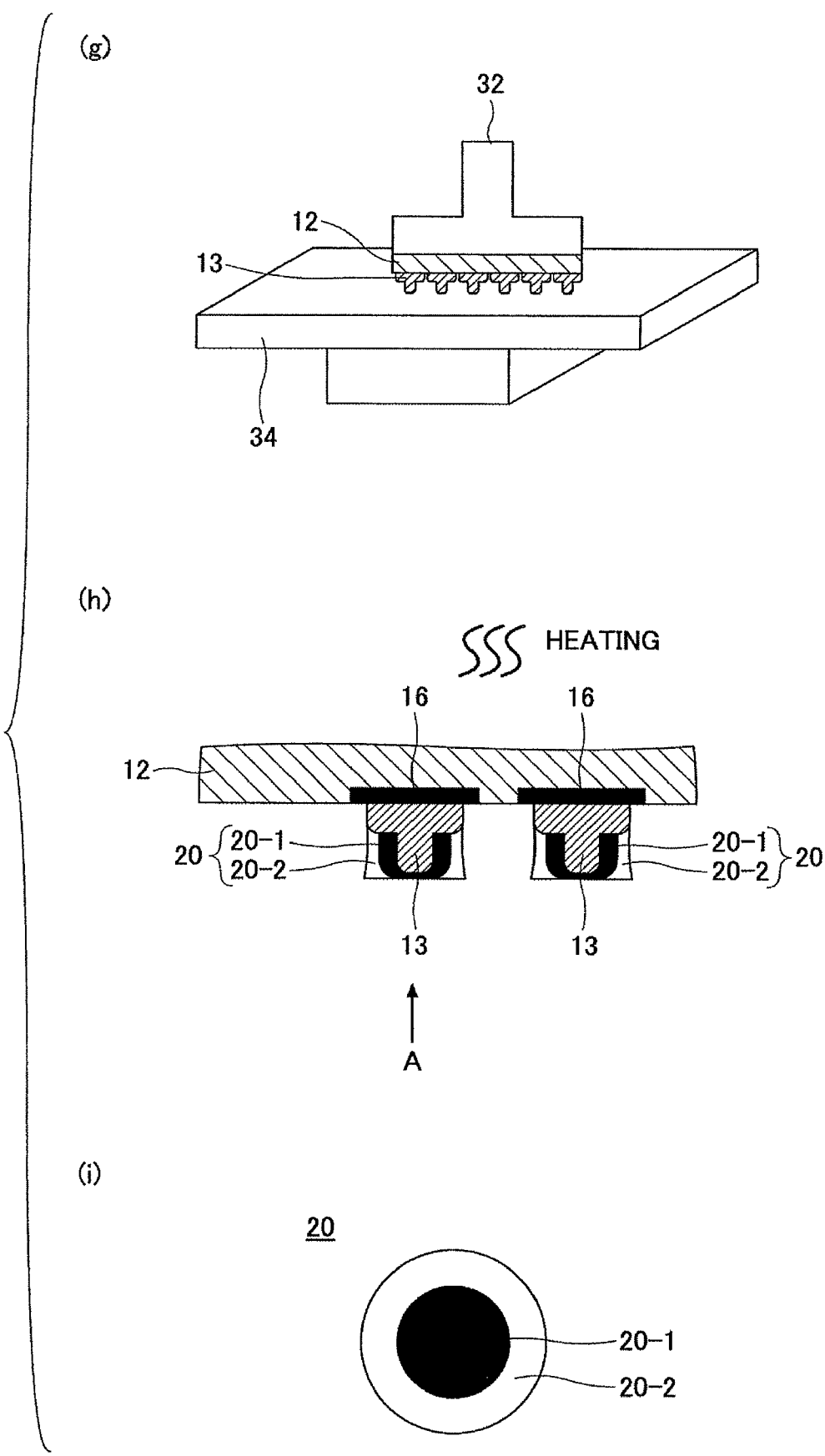
FIG. 6 is a third view of the first manufacturing method of the semiconductor device of the embodiment of the present invention.
Figure 7:
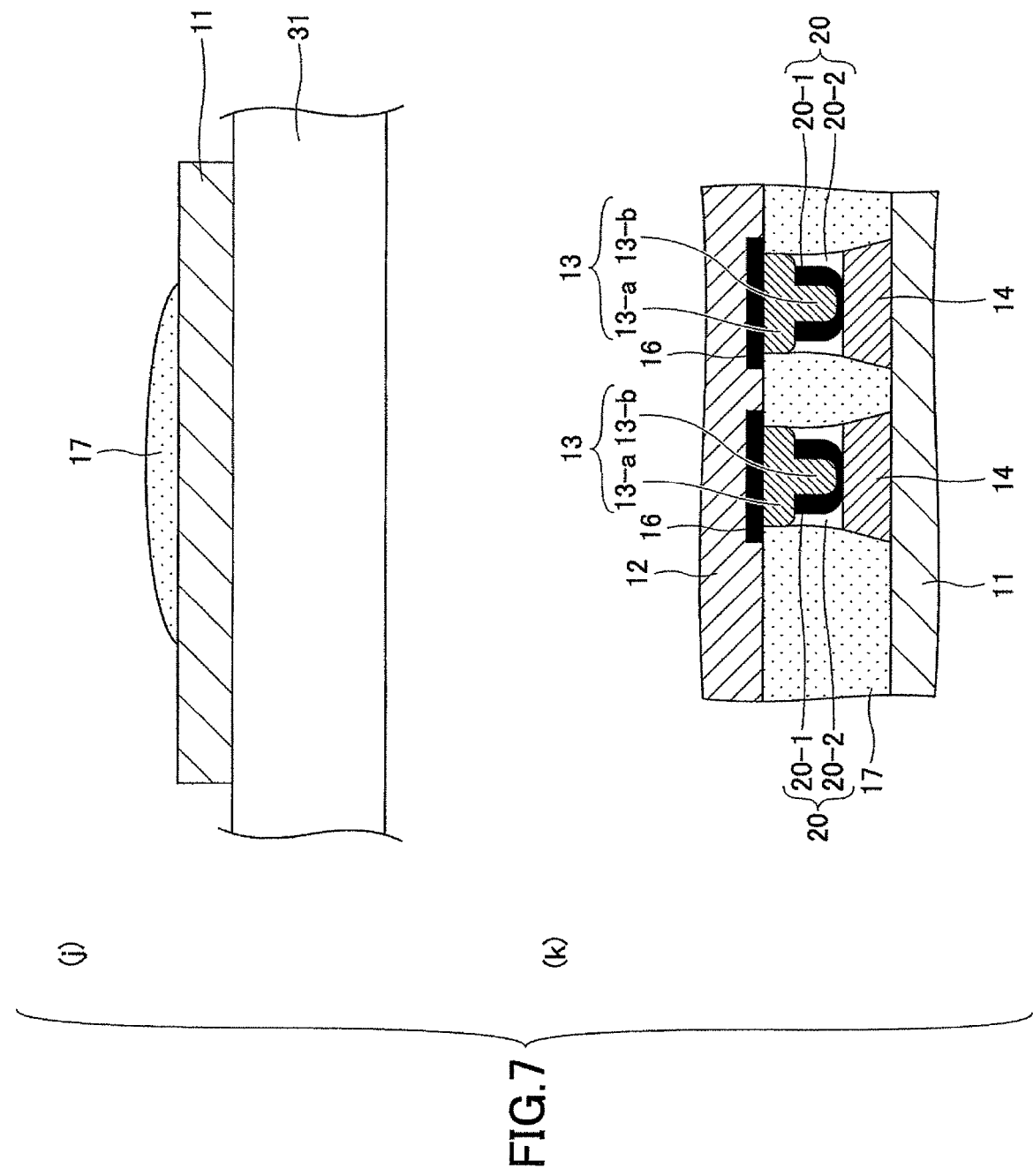
FIG. 7 is a fourth view of the first manufacturing method of the semiconductor device of the embodiment of the present invention.

As shown in FIG. 3, the first conductive adhesive 20-1 is exposed substantially in the center of the surface where the conducive adhesive 20 is connected to the bonding electrode 14 of the wiring board 11 in a state where the first conductive adhesive 20-1 is surrounded by the second conductive adhesive 20-2.

Under this structure, even if volume resistivity of the second conductive adhesive 20-2 where tin (Sn) or mixture (intermetallic compound) or alloy whose main ingredient is tin (Sn) is dispersed in the binder resin as the conductive filler is high, since the first conductive adhesive 20-1 is exposed in the substantially center of the surface connecting to the bonding electrode 14 of the wiring board 11, it is possible to securely achieve conductivity between the bonding electrode 14 of the wiring board 11 and the convex shaped outside connection terminals 13 of the semiconductor element 12. Here, in the first conductive adhesive 20-1, silver (Ag) or a mixture (intermetallic compound) or an alloy whose main ingredient is silver (Ag) is dispersed as a conductive filler in the abovementioned binder resin. Silver (Ag) has a low volume resistivity and low contact resistance with gold (Au) forming the convex shaped outside connection terminals 13 of the semiconductor element 12.

Referring back to FIG. 1, the underfill material 17 which is an adhesive made of, for example, epoxy resin, polyimide resin, acrylic resin, silicon resin, or another thermosetting insulation resin is supplied between the semiconductor element 12 and the upper surface of the wiring board 11 by a dispensing method, a printing method, a transferring method, or the like. Conductive particles of silver (Ag), solder or nickel (Ni) may be includes in the underfill material 17.

As discussed above, the semiconductor device 10 of the embodiment of the present invention has an arrangement structure of the conductive adhesive 20 discussed with reference to FIG. 2 and FIG. 3. In addition, in the semiconductor device 10, the semiconductor element 12 is mounted and fixed on the main surface of the wiring board 11 in a flip-chip (face down) state.

Furthermore, the conductive adhesive 20 in this example has a two-layer structure formed by the first conductive adhesive 20-1 and the second conductive adhesive 20-2. The conductive adhesive connects the convex shaped outside connection terminals 13 of the semiconductor device 12 and the bonding electrodes 14 of the wiring board 11 to each other. The second conductive adhesive 20-2 is formed outside the first conductive adhesive 20-1 so as to cover the external circumferential surface of the first conductive adhesive 20-1. The first conductive adhesive 20-1 is exposed on the surface where the conductive adhesive 20 is connected to the bonding electrodes 14 of the wiring board 11.

In the first adhesive 20-1, silver (Ag) or a mixture (intermetallic compound) or an alloy whose main ingredient is silver (Ag) is dispersed as a conductive filler in the binder resin. Silver (Ag) has low contact resistance with gold (Au) forming the convex shaped outside connection terminals 13 of the semiconductor element 12. Such a first conductive adhesive 20-1 is exposed substantially in the center of the surfaces connecting to the bonding electrodes 14 of the wiring board 11. Accordingly, it is possible to securely achieve the conductivity between the convex shaped outside connection terminals 13 of the semiconductor element 12 and the bonding electrodes 14 of the wiring board 11.

Furthermore, by the oxide film of tin (Sn) formed on the external surface of the second conductive adhesive 20-2, it is possible to prevent hydroxide ions ($OH^-$) supplied from the wiring board 11 or the underfill material 17 from being taken into the first conductive adhesive 20-1 too much.

Accordingly, it is possible to secure high reliability of the semiconductor device even if a narrow pitch connection of the convex shaped outside connection terminals 13 of the semiconductor element cannot be avoided. Hence, the embodiment of the present invention can contribute high functionality to the electronic apparatus where the semiconductor device is mounted.

[Manufacturing Method of the Semiconductor Device]

Next, manufacturing methods of the semiconductor device of the embodiment of the present invention are discussed. Here, two kinds of the methods are discussed.

1. A First Manufacturing Method of the Semiconductor Device

FIG. 4 through FIG. 7 are first through fourth views of the first manufacturing method of the semiconductor device of the embodiment of the present invention.

In the first manufacturing method of the semiconductor device of the embodiment of the present invention, a flip chip bonder 30 shown in FIG. 4(a) is used. The flip chip bonder 30 includes a bonding stage 31, an absorbing tool 32, a transferring stage 33 (33-1, 33-2), a leveling stage 34, and others. The wiring board 11 is mounted on the bonding stage 31. The absorbing tool 32 applies an attracting force to and holds the semiconductor element 12 and carries the semiconductor element 12 in a direction indicated by an arrow in FIG. 4(a). The leveling stage 34 is made of glass where, for example, fluororesin is coated.

The inventor of the present invention performed a test of the manufacturing method of the semiconductor device of the embodiment of the present invention by using FCB2M made by Panasonic Factory Engineering as the flip chip bonder 30.

FIG. 4(b) is an expanded view of the semiconductor element 12 held by the absorbing tool 32. The semiconductor element 12 includes a silicon (Si) semiconductor substrate formed by a known semiconductor manufacturing process. The convex shaped outside connection terminals 13 are formed on the outside connection terminal pads 16 of the semiconductor element 12.

The convex shaped outside connection terminal 13 is formed by, for example, a so-called ball bonding method using a wire bonding technique. More specifically, a seating part is formed by pressure fixing or connecting a gold (Au) ball and a projection part projecting from the seating part so that the convex (projection) shaped outside connection terminal 13 is formed. A flattening process is applied to a top part of the projection part of the convex shaped outside connection terminal 13, if necessary.

The inventor of the present invention performed a test of the manufacturing method of the semiconductor device of the embodiment of the present invention by using a semiconductor element having a rectangular shaped plan configuration of 6.5 mm×6.5 mm, where 360 convex shaped outside connection terminals 13 made of gold (Au) with height of 30 μm are formed at a 50 μm pitch on the semiconductor element 12.

The semiconductor element 12 is held by the absorbing tool 32 so that the surface of the semiconductor element 12 where the convex outside connection terminals 13 are formed faces down and is moved above a first transferring stage 33-1 as shown in FIG. 4(c).

The first conductive adhesive 20-1 is coated on the first transferring stage 33-1. The thickness of the first conductive adhesive 20-1 is adjusted by a squeegee (blade) 35-1 which can be moved in a direction indicated by a white arrow in FIG. 4(c) so as to have a designated thickness such as approximately 10 μm.

As the first conductive adhesive 20-1, an adhesive is used where silver (Ag) or a mixture (intermetallic compound) or an alloy whose main ingredient is silver (Ag) is dispersed as a conductive filler in the binder resin. Silver (Ag) has a low volume resistivity and low contact resistance with gold (Au) forming the convex shaped outside connection terminal 13 of the semiconductor element 12. Silver palladium (AgPd), for example, can be used as a mixture (intermetallic compound) or an alloy whose main ingredient is silver (Ag). As the binder resin, an epoxy composition, an acrylic composition, a vinyl composition, a thermosetting composition such as a composition where a hydroxyl group is provided at an end, a resin composition soluble in a solvent, a mixture of them, or the like can be used. In the epoxy resin as the binder resin, an epoxy based compound as an epoxy curing agent is an essential ingredient and a surface active agent or flux may be applied.

The inventor of the present invention used an adhesive where silver (Ag) particles having 100 nm average particle diameter are dispersed in epoxy resin (for example, ADEKA HARDNER EH series made by ADEKA), as the first adhesive 20-1. The inventor of the present invention coated the first conductive adhesive 20-1 on the first transferring stage 33-1 and adjusted the thickness of the first conductive adhesive 20-1 by using the squeegee (blade) 35-1 so that the first conductive adhesive 20-1 has a thickness of approximately 10 μm.

At this stage, the absorbing tool 32 holding the semiconductor element 11 is lowered so that the semiconductor element 11 is pushed onto the first transferring stage 33-1 by a load (force) of approximately 4.9 N and the semiconductor element 11 is dipped in the first conductive adhesive 20-1. As a result of this, the first conductive adhesive 20-1 is transferred to the convex shaped outside connection terminals 13 of the semiconductor element 12.

After the first conductive adhesive 20-1 is transferred to the convex shaped outside connection terminals 13 of the semiconductor element 12, the first conductive adhesive 20-1 is heated at, for example, 70 through 240° C. by the absorbing tool 32 holding the semiconductor element 12 so as to be provisionally cured.

The inventor of the present invention heated, in this step, the first conductive adhesive 20-1 at 180° C. for 90 seconds by using the absorbing tool 32.

After the first conductive adhesive 20-1 is provisionally cured for a short period of time, in order to improve productivity, as shown in FIG. 5(d), the semiconductor element 32 having the convex shaped outside connection terminals 13 where the provisionally cured first conductive adhesive 20-1 is provided is taken so as to be received in an oven 36 in a nitrogen ($N_2$) environment. In the oven 36, the semiconductor element 32 is heated for 60 minutes at approximately 200° C. so that the first conductive adhesive 20-1 is cured.

The inventor of the present invention performed this heating process in the oven 36 of the nitrogen ($N_2$) environment by using an inert oven made by Yamato Scientific Co., Ltd. for 60 minutes. For example, in a case where a conductive adhesive 84-1LMISR$ is used as the first conductive adhesive 20-1, an elastic modulus after curing is approximately 4 GPa.

For the convenience of explanation, the above-mentioned semiconductor element 12 is shown in an expanded manner in FIG. 5(d).

Next, the semiconductor element 32 having the convex shaped outside connection terminals 13 where the cured first conductive adhesive 20-1 is provided is held by the absorbing tool 32 to move above the second transferring stage 33-2 with the surface of the semiconductor element 32 where the convex shaped outside connection terminals 13 are formed facing down. This is shown in FIG. 5(e). In FIG. 5(e), for the convenience of explanation, illustration of the first conductive adhesive 20-1 formed on the convex shaped outside connection terminals 13 is omitted.

The second conductive adhesive 20-2 is coated on the second transferring stage 33-2. The thickness of the second conductive adhesive 20-2 is adjusted by a squeegee (blade) 35-2 which can be moved in a direction indicated by a white arrow in FIG. 5(e) so as to have a designated thickness such as approximately 15 μm.

As the second conductive adhesive 20-2, an adhesive is used where tin (Sn) or a mixture (intermetallic compound) or an alloy whose main ingredient is tin (Sn) is dispersed as a conductive filler in the binder resin. As the binder resin, an epoxy composition, an acrylic composition, a vinyl composition, a thermosetting composition such as a composition where a hydroxyl group is provided at an end, a resin composition soluble in a solvent, a mixture of them, or the like is used. In the epoxy resin as the binder resin, an epoxy based compound as an epoxy curing agent is an essential ingredient and a surface active agent or flux may be applied.

An adhesive where 30 wt % or more of, for example, zinc (Zn), cobalt (Co), iron (Fe), palladium (Pd), platinum (Pt), or an alloy including these metals, instead of tin (Sn) or a mixture (intermetallic compound) or an alloy whose main ingredient is tin (Sn), is dispersed in the binder resin may be used as the second conductive adhesive 20-2.

The inventor of the present invention used an adhesive where 30 wt % or more of tin (Sn) particles having 0.1 nm average particle diameter are dispersed in binder resin as the second adhesive 20-2.

At this stage, the absorbing tool 32 holding the semiconductor element 11 is lowered so that the semiconductor element 11 is pushed onto the second transferring stage 33-2 by a load of approximately 4.9 N and the semiconductor element 11 is dipped in the second conductive adhesive 20-2. As a result of this, the second conductive adhesive 20-2 is transferred onto the convex shaped outside connection terminals 13 of the semiconductor element 12 covered with the first conductive adhesive 20-1.

This is shown in FIG. 5(f). At this time, while the first conductive adhesive 20-1 is cured by the step shown in FIG. 5(d), the second conductive adhesive 20-2 is not cured but remains a paste. In FIG. 5(f), for the convenience of explanation, the above-discussed semiconductor element 12 is shown in an expanded manner.

Next, the semiconductor element 32 having the convex shaped outside connection terminals 13 where the cured first conductive adhesive 20-1 is provided is held by the absorbing tool 32 to move above the leveling stage 34 so that the surface of the semiconductor element 32 where the convex shaped outside connection terminals 13 are formed faces down. The absorbing tool 32 is lowered so that the semiconductor element 11 is pushed onto the leveling stage with a load of approximately 4.9 N or approximately 0.01 through 10 gf per each the convex shaped outside connection terminal 13. This is shown in FIG. 6(g). In FIG. 6(g), for the convenience of explanation, illustrations of the second conductive adhesive 20-2 and the first conductive adhesive 20-1 formed on the convex shaped outside connection terminals 13 are omitted.

The semiconductor element 12 is heated at a designated temperature such as 50 through 180° C. by the absorbing tool 32 holding the semiconductor element 12. A leveling process of the second conductive adhesive 20-2 transferred to the convex shaped outside connection terminal 13 covered with the first conductive adhesive 20-1 is performed, so that an organic solvent contained in the second conductive adhesive 20-2 is evaporated and flowing properties of the second conductive adhesive 20-2 are reduced. This is shown in FIG. 6(h). In FIG. 6(h), for the convenience of explanation, the semiconductor element 12 is shown in an expanded manner.

The inventor of the present invention performed this leveling process by heating at 120° C. for 30 seconds with the absorbing tool 32.

As shown in FIG. 6(h), by this step, the conductive adhesive 20 has a two-layer structure formed by the first conductive adhesive 20-1 and the second conductive adhesive 20-2. More specifically, a layer formed by the first conductive adhesive 20-1 is situated around the projection part 13-b positioned on the seating part 13-a of the convex shaped outside connection terminal 13. The second conductive adhesive 20-2 is formed outside the first conductive adhesive 20-1 so as to cover the external circumferential surface of the first conductive adhesive 20-1.

Since the second conductive adhesive 20-2 is not cured at this time, as a leveling load is applied in the leveling process, a lower side part (a side of the head end of the convex shaped outside connection terminal 13) of the second conductive adhesive 20-2 is moved outside. If an applied load exceeds a designated force, as show in FIG. 6(i), a lower surface of the first conductive adhesive 20-1, namely a surface to be connected to the bonding electrodes 14 of the wiring board 11 in the following step, is exposed so that the first conductive adhesive 20-1 is surrounded by the second conductive adhesive 20-2. Here, FIG. 6(i) is a view of the conductive adhesive 20 where the leveling process is applied, seen in the direction indicated by an arrow A in FIG. 6(h).

Thus, in the second conductive adhesive 20-2, tin (Sn) or a mixture (intermetallic compound) or an alloy whose main ingredient is tin (Sn) is dispersed as a conductive filler in the binder resin. In addition, as the first conductive adhesive 20-1, an adhesive is used where silver (Ag) or a mixture (intermetallic compound) or an alloy whose main ingredient is silver (Ag) is dispersed as a conductive filler in the binder resin. Silver (Ag) has a low volume resistivity and low contact resistance with gold (Au) forming the convex shaped outside connection terminal 13 of the semiconductor element 12. Even if the volume resistivity of the second conductive adhesive 20-2 is high, the first conductive adhesive 20-1 is exposed substantially in the center of the surface connecting to the bonding electrode 14 of the wiring board 11. Accordingly, in a following step of connecting the semiconductor element 12 to the wiring board 11, it is possible to securely achieve electrical conductivity between the convex shaped outside connection terminal 13 of the semiconductor element 12 and the bonding electrode 14 of the wiring board 11.

Next, the convex shaped outside connection terminals 13 of the semiconductor element 12 having a two-layer structure formed by the first conductive adhesive 20-1 and the second conductive adhesive 20-2 and the bonding electrodes 14 of the wiring board 11 are connected so that the semiconductor element 12 and the wiring board 11 are connected to each other.

As shown in FIG. 7(j), the paste underfill material 17 is applied on the wiring board 31 mounted and fixed on the bonding stage 31. As the underfill material 17, epoxy resin, polyimide resin, acrylic resin, silicon resin, or another thermosetting insulation resin may be used. The underfill material 17 may be provided by a dispensing method, a printing method, a transferring method, or the like. Conductive particles made of silver (Ag), solder or nickel (Ni) may be applied to the underfill material 17.

At this time, the wiring board 11 may be heated at a designated temperature by heating the above-mentioned bonding stage. As a result of this, the viscosity of the underfill material 17 applied on the wiring board 11 is reduced so that the flow properties of the underfill material 45 can be improved.

The inventor of the present invention used E-1206 made by Emerson & Cuming as the underfill material 17 for implementing a test of this manufacturing method.

Next, the absorbing tool 32 (not shown in FIG. 7(j)) holding the semiconductor element 12 is lowered so that the main surface of the wiring board 11 where the underfill material 17 is applied is parallel with the main surface of the semiconductor element 12. While heating by the absorbing tool 32 is maintained, the load is applied so that the semiconductor element 12 is fixed to the wiring board via the underfill material 17. This is shown in FIG. 7(k). In FIG. 7(k), for the convenience of explanation, the above-discussed semiconductor element 12 is shown in an expanded manner.

For implementing the test of the manufacturing method, the inventor of the present invention applied a load of 25.5 N to the bonding electrodes 14 of the wiring board 11 where the underfill material 17 is applied and applied heating at 220° C. for 60 seconds.

As discussed above, in the second conductive adhesive 20-2, tin (Sn) or a mixture (intermetallic compound) or an alloy whose main ingredient is tin (Sn) is dispersed as a conductive filler in the binder resin.

Due to heat applied when the convex shaped outside connection terminals 13 of the semiconductor element 12 are connected to the bonding electrodes 14 of the wiring board 11, the second conductive adhesive 20-2 takes oxygen ($O_2$) from the environment so that a thin oxide film is formed on an external surface of the second conductive adhesive 20-2.

Accordingly, even if silver (Ag) or silver contained in a mixture (intermetallic compound) or an alloy whose main ingredient is silver (Ag) is eluted as ions, by the oxide film of tin (Sn) formed on the external surface of the second conductive adhesive 20-2, it is possible to prevent hydroxide ion ($OH^-$) supplied from the wiring board 11 or the underfill material 17 from being taken into the first conductive adhesive 20-1 too much.

Accordingly, in this example as compared to a case such as the case discussed in Japanese Patent No. 3409957, where silver (Ag) is formed on the outermost external circumferential part of the convex shaped outside connection terminals of the semiconductor element, it is possible to reduce ratios of a case where silver ions (Ag+) and hydroxide ions (OH−) are associated with each other. Hence, it is possible to prevent dendrite formation causing the ion migration and prevent shorts between the semiconductor element 12 and the wiring board 11 due to ion migration of silver (Ag).

Thus, the semiconductor element 12 is mounted and fixed on the main surface of the wiring board 11 by a flip-chip (face down) method. Furthermore, at least the projection part of the convex shaped outside connection terminals 13 of the semiconductor element 12 and the bonding electrodes 14 on the wiring board corresponding to the projection parts are commonly covered with the conductive adhesive 20 having the above-mentioned two-layer structure. Thus, at least the projection part of the convex shaped outside connection terminals 13 and the bonding electrodes 14 are mechanically and electrically connected to each other.

After that, the semiconductor element 12 is released by the absorbing tool 32 and the absorbing tool 32 rises.

Then, outside connecting electrodes 15 such as solder balls made of tin (Sn)—silver (Ag) solder or tin (Sn)—silver (Ag)—copper (Cu) are provided in a grid manner on the rear surface of the wiring board 11 which is the surface situated opposite to the surface where plural semiconductor elements 12 are mounted.

After that, the wiring board 11 is cut into plural parts where the semiconductor elements 12 are mounted by using a dicing blade or the like. As a result of this, the semiconductor device 10 where the semiconductor element 12 is flip-chip mounted on the wiring board 11 is formed.

If a sealing process is necessary for the semiconductor element 12, for example, before the wiring board 11 is cut into pieces, a resin sealing process is performed on the surface of the wiring board 11 where the semiconductor elements 12 are mounted. After the resin sealing process, the wiring board 11 and the sealing resin part are cut in the thickness direction into parts on each of which a semiconductor element 12 is mounted. Thus, the semiconductor device which is sealed by resin and cut can be formed.

Thus, the adhesive 20 is provided in the semiconductor device 10 formed by the above-discussed manufacturing method. The adhesive 20 has a two-layer structure where the second conductive adhesive 20-2 is formed outside the first conductive adhesive 20-1 so as to cover the external circumferential surface of the first conductive adhesive 20-1. The first conductive adhesive 20-1 is exposed in the surface where the conductive adhesive 20 is connected to the bonding electrodes 14 of the wiring board 11. Accordingly, it is possible to securely achieve conductivity between the convex shaped outside connection terminals 13 of the semiconductor element 12 and the bonding electrodes 14 of the wiring board 11.

In addition, by the oxide film of tin (Sn) formed on the external surface of the second conductive adhesive 20-2, it is possible to prevent hydroxide ions (OH−) supplied from the wiring board 11 or the underfill material 17 from being taken into the first conductive adhesive 20-1 too much. Therefore, it is possible to prevent dendrite formation causing the ion migration and prevent shorts between the semiconductor element 12 and the wiring board 11 due to ion migration of silver (Ag).

Accordingly, it is possible to secure high reliability of the semiconductor device even if narrow pitch connection of the convex shaped outside connection terminals of the semiconductor element cannot be avoided. Hence, the embodiment of the present invention can contribute to high functionality of the electronic apparatus where the semiconductor device is mounted.

According to the test performed by the inventor of the present invention, in the semiconductor device manufactured by the manufacturing method of the embodiment of the present invention, it was recognized that insulation resistance after 1000 hours passed was equal to or greater than $1 \times 10^{10} \Omega$, the ion migration of silver (Ag) was prevented, and high reliability of the semiconductor device was secured.

Heating conditions such as heating temperature in the present invention are not limited to the above-discussed example. The heating conditions such as heating temperature are properly determined based on materials of the first conductive adhesive 20-1 and the second conductive adhesive 20-2.

2. A Second Manufacturing Method of the Semiconductor Device

Figure 8:
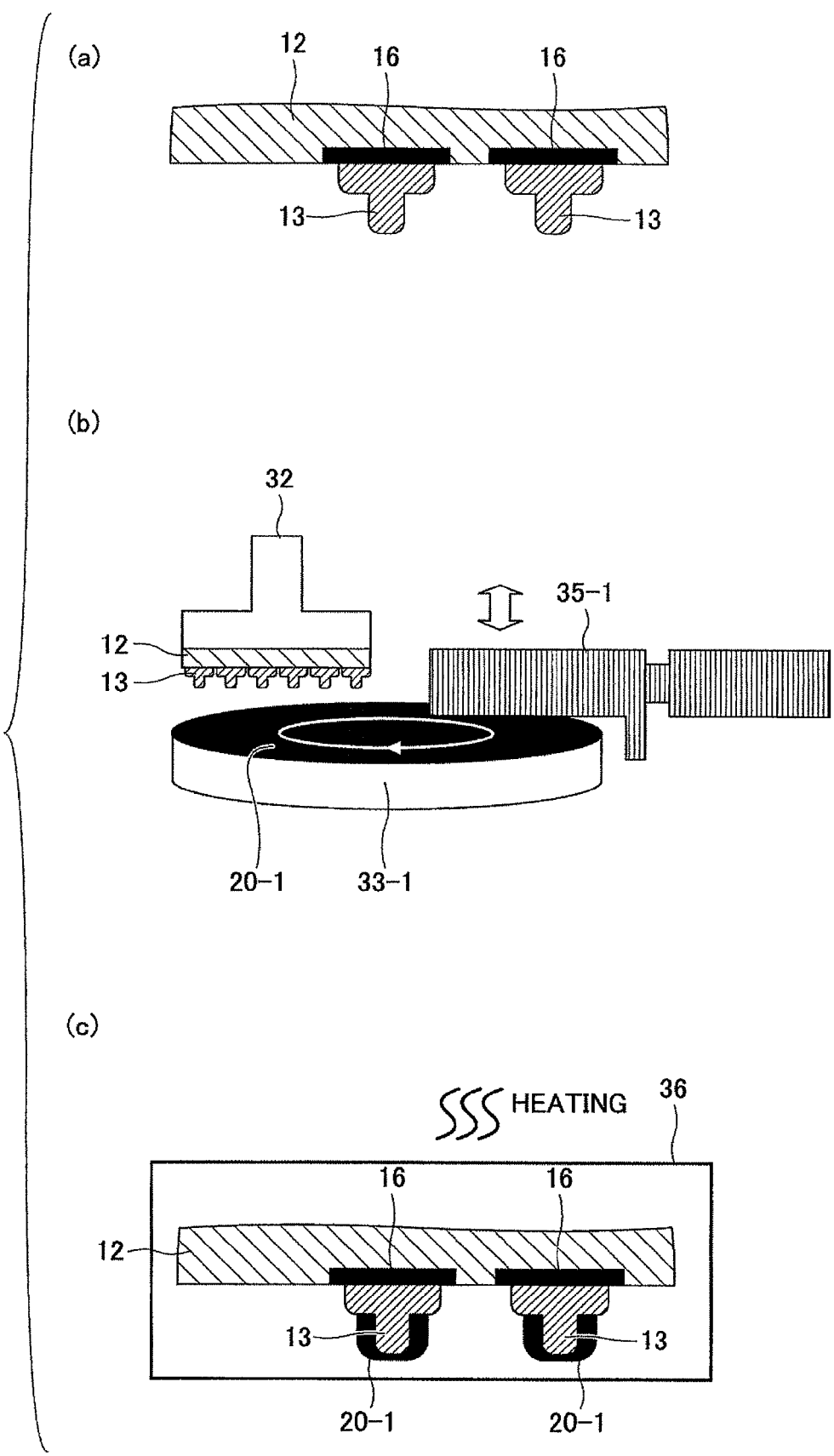
FIG. 8 is a first view of a second manufacturing method of the semiconductor device of the embodiment of the present invention.
Figure 9:
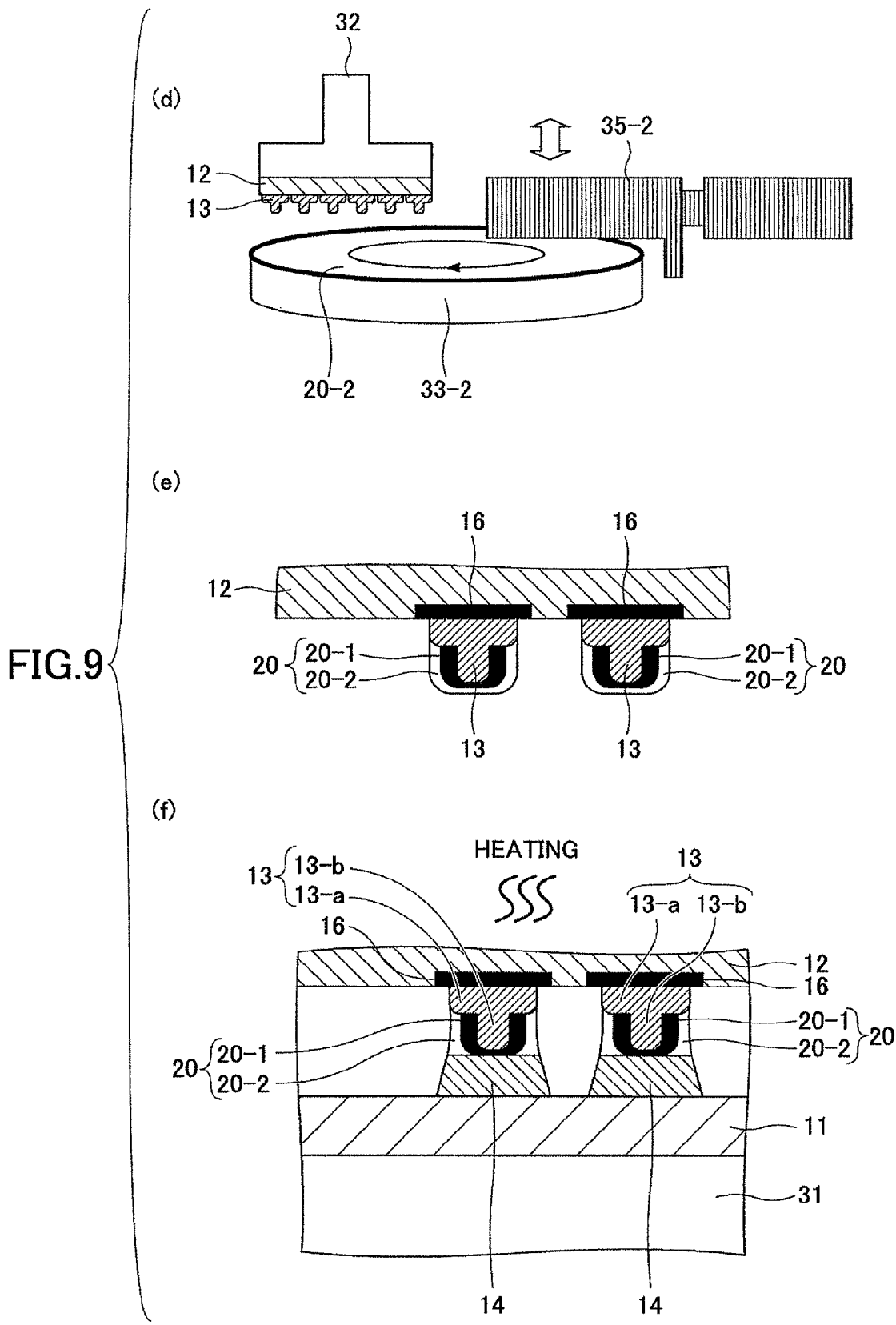
FIG. 9 is a second view of the second manufacturing method of the semiconductor device of the embodiment of the present invention.
Figure 10:
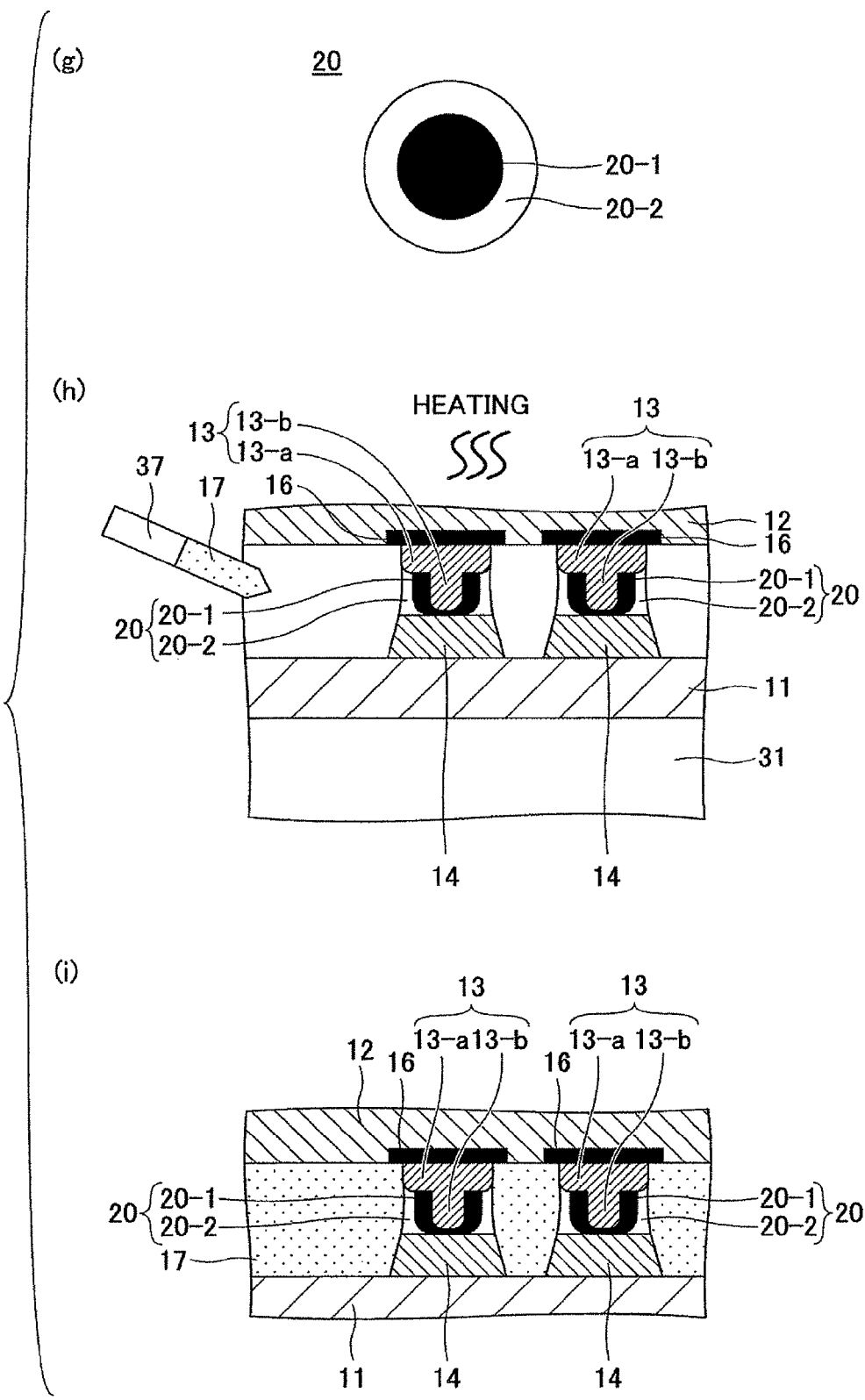
FIG. 10 is a third view of the second manufacturing method of the semiconductor device of the embodiment of the present invention.

FIG. 8 through FIG. 10 are first through third views of the second manufacturing method of the semiconductor device of the embodiment of the present invention.

In the second manufacturing method of the semiconductor device of the embodiment of the present invention, the flip chip bonder 30 (see FIG. 4(a)) used in the above-discussed first manufacturing method is used. In the second manufacturing method unlike the first manufacturing method, the leveling stage 34 is not used.

The inventor of the present invention performed a test of the second manufacturing method of the semiconductor device of the embodiment of the present invention by using FCB2M made by Panasonic Factory Engineering as the flip chip bonder 30.

FIG. 8(a) is an expanded view of the semiconductor element 12 held by the absorbing tool 32. The semiconductor element 12 includes a silicon (Si) semiconductor substrate formed by a known semiconductor manufacturing process. The convex shaped outside connection terminals 13 are formed on the outside connection terminal pads 16 of the semiconductor element 12.

The convex shaped outside connection terminal 13 is formed by, for example, a so-called ball bonding method using a wire bonding technique. More specifically, a seating part is formed by pressure fixing or connecting a gold (Au) ball and a projection part projecting from the seating part so that the convex (projection) shaped outside connection terminal 13 is formed. A flattening process is applied to a top part of the projection part of the convex shaped outside connection terminal 13, if necessary.

The inventor of the present invention performed a test of the manufacturing method of the semiconductor device of the embodiment of the present invention, by using a semiconductor element having a rectangular shaped plan configuration of 6.5 mm×6.5 mm and where 360 convex shaped outside connection terminals 13 made of gold (Au) with height of 30 µm are formed at 50 µm pitch, as the semiconductor element 12.

The semiconductor element 12 is held by the absorbing tool 32 so that the surface of the semiconductor element 12 where the convex outside connection terminals 13 are formed is faced down and is moved above a first transferring stage 33-1. This is shown in FIG. 8(b).

The first conductive adhesive 20-1 is coated on the first transferring stage 33-1. The thickness of the first conductive adhesive 20-1 is adjusted by a squeegee (blade) 35-1 which can be moved in a direction indicated by a white arrow in FIG. 4(c) so as to have a designated thickness such as approximately 10 µm.

As the first conductive adhesive 20-1, an adhesive is used where silver (Ag) or a mixture (intermetallic compound) or an alloy whose main ingredient is silver (Ag) is dispersed as a conductive filler in the binder resin. Silver (Ag) has a low volume resistivity and low contact resistance with gold (Au) forming the convex shaped outside connection terminal 13 of the semiconductor element 12. Silver palladium (AgPd), for example, can be used as a mixture (intermetallic compound) or an alloy whose main ingredient is silver (Ag). As the binder resin, an epoxy composition, an acrylic composition, a vinyl composition, a thermosetting composition such as a composition where a hydroxyl group is provided at an end, a resin composition soluble in a solvent, a mixture of them, or the like can be used. In the epoxy resin as the binder resin, an epoxy based compound as an epoxy curing agent is an essential ingredient and a surface active agent or flux may be applied.

The inventor of the present invention used an adhesive where silver (Ag) particles having 100 nm average particle diameter are dispersed in epoxy resin (for example, ADEKA HARDNER EH series made by ADEKA), as the first adhesive 20-1. The inventor of the present invention coated the first conductive adhesive 20-1 on the first transferring stage 33-1 and adjusted the thickness of the first conductive adhesive 20-1 with the squeegee (blade) 35-1 so that the first conductive adhesive 20-1 has a thickness of approximately 10 µm.

At this stage, the absorbing tool 32 holding the semiconductor element 11 is lowered so that the semiconductor element 11 is pushed onto the first transferring stage 33-1 by a force of approximately 4.9 N and the semiconductor element 11 is dipped in the first conductive adhesive 20-1. As a result of this, the first conductive adhesive 20-1 is transferred onto the convex shaped outside connection terminal 13 of the semiconductor element 12.

After the first conductive adhesive 20-1 is transferred onto the convex shaped outside connection terminal 13 of the semiconductor element 12, the first conductive adhesive 20-1 is heated at, for example, 70 through 240° C., by the absorbing tool 32 holding the semiconductor element 12 so as to be provisionally cured. The inventor of the present invention heated, in this step, the first conductive adhesive 20-1 at 180° C. for 90 seconds by using the absorbing tool 32.

After the first conductive adhesive 20-1 is provisionally cured for a short period of time, in order to improve productivity, as shown in FIG. 8(c), the semiconductor element 32 having the convex shaped outside connection terminals 13 where the provisionally cured first conductive adhesive 20-1 is provided is taken so as to be received in an oven 36 in a nitrogen (N$_2$) environment. In the oven 36, the semiconductor element 32 is heated for 60 minutes at approximately 200° C. so that the first conductive adhesive 20-1 is cured.

The inventor of the present invention performed this heating process in the oven 36 with the nitrogen (N$_2$) environment by using an inert oven made by Yamato Scientific Co., Ltd. for 60 minutes. For example, in a case where a conductive adhesive 84-1LMISR$ is used as the first conductive adhesive 20-1, its elastic modulus after curing is approximately 4 GPa.

For the convenience of explanation, the above-mentioned semiconductor element 12 is shown in an expanded manner in FIG. 8(c).

Next, the semiconductor element 12 having the convex shaped outside connection terminals 13 where the cured first conductive adhesive 20-1 is provided is held by the absorbing tool 32 to move above the second transferring stage 33-2 so that the surface of the semiconductor element 32 where the convex shaped outside connection terminals 13 are formed faces down. This is shown in FIG. 9(d). In FIG. 9(d), for the convenience of explanation, illustration of the first conductive adhesive 20-1 formed on the convex shaped outside connection terminals 13 is omitted.

The second conductive adhesive 20-2 is coated on the second transferring stage 33-2. The thickness of the second conductive adhesive 20-2 is adjusted by a squeegee (blade) 35-2 which can be moved in a direction indicated by a white arrow in FIG. 5(d) so as to have a designated thickness such as approximately 15 µm.

As the second conductive adhesive 20-2, an adhesive is used tin (Sn) or a mixture (intermetallic compound) or alloy whose main ingredient is tin (Sn) is dispersed as a conductive filler in the binder resin. As the binder resin, an epoxy composition, an acrylic composition, a vinyl composition, a thermosetting composition such as a composition where a hydroxyl group is provided at an end, a resin composition soluble in a solvent, a mixture of them, or the like may be used. In the epoxy resin as the binder resin, an epoxy based compound as an epoxy curing agent is an essential ingredient and a surface active agent or flux may be applied.

An adhesive where 30 wt % or more of, for example, zinc (Zn), cobalt (Co), iron (Fe), palladium (Pd), platinum (Pt), or an alloy including these metals, instead of tin (Sn) or a mixture (intermetallic compound) or an alloy whose main ingredient is tin (Sn), is dispersed in the binder resin may be used as the second conductive adhesive 20-2.

The inventor of the present invention used an adhesive where 30 wt % or more of rate of tin (Sn) particles having 0.1 nm of average particle diameter are dispersed in binder resin, as the second adhesive 20-2.

At this stage, the absorbing tool 32 holding the semiconductor element 12 is lowered so that the semiconductor element 12 is pushed onto the second transferring stage 33-2 by a load of approximately 4.9 N and the semiconductor element 12 is dipped in the second conductive adhesive 20-2. As a result of this, the second conductive adhesive 20-2 is transferred onto the convex shaped outside connection terminals 13 of the semiconductor element 12 covered with the first conductive adhesive 20-1.

This is shown in FIG. 9(e). At this time, while the first conductive adhesive 20-1 cured by the step shown in FIG. 8(c), the second conductive adhesive 20-2 is not cured but remains a paste state. In FIG. 9(e), for the convenience of explanation, the above-discussed semiconductor element 12 is shown in an expanded manner.

Next, the convex shaped outside connection terminals 13 of the semiconductor element 12 where the first conductive adhesive 20-1 covers and the second conductive adhesive 20-2 is transferred is connected to the bonding electrodes 14 of the wiring board 11, so that the semiconductor element 12 is connected to the wiring board 11.

More specifically, the absorbing tool 32 holding the semiconductor element 12 is lowered so that the main surface of the wiring board 11 mounted on the bonding stage 31 is parallel with the main surface of the semiconductor element 12.

While heating by the absorbing tool 32 is maintained, the load is applied so that the semiconductor element 12 is mounted on the wiring board 11. This is shown in FIG. 9(f). In FIG. 9(f), for the convenience of explanation, the above-discussed semiconductor element 12 is shown in an expanded manner.

At this time, the wiring board 11 may be heated at a designated temperature by heating the above-mentioned bonding stage 32. As a result of this, the viscosity of the underfill material 17 applied on the wiring board 11 in the following steps is reduced so that the flow properties of the underfill material 45 can be improved.

For implementing the test of the manufacturing method, the inventor of the present invention set the heating temperature of the absorbing tool 32 to 40° C. and applied a load of 4.9 N to the bonding electrodes 14 of the wiring board 11 for 10 seconds. Then, the inventor of the present invention applied a load of 24.5 N and heated at 220° C. for 60 seconds.

As discussed above, in the second conductive adhesive 20-2, tin (Sn) or a mixture (intermetallic compound) or an alloy whose main ingredient is tin (Sn) is dispersed as a conductive filler in the binder resin.

Due to heat applied when the convex shaped outside connection terminals 13 of the semiconductor element 12 are connected to the bonding electrodes 14 of the wiring board 11, the second conductive adhesive 20-2 takes oxygen ($O_2$) from the environment so that a thin oxide film is formed on an external surface of the second conductive adhesive 20-2.

Accordingly, even if silver (Ag) or silver contained in a mixture (intermetallic compound) or an alloy whose main ingredient is silver (Ag) is eluted as ions, by the oxide film of tin (Sn) formed on the external surface of the second conductive adhesive 20-2, it is possible to prevent a hydroxide ions ($OH^-$) supplied from the wiring board 11 or the underfill material 17 from being taken into the first conductive adhesive 20-1 too much. Accordingly, in this example as compared to a case, such as a case discussed in Japanese Patent No. 3409957, where silver (Ag) is formed on the outermost external circumferential part of the convex shaped outside connection terminal of the semiconductor element, it is possible to reduce ratios of a case where silver ions ($Ag^+$) and a hydroxide ions ($OH^-$) are associated with each other. Hence, it is possible to prevent dendrite formation causing the ion migration and prevent shorts between the semiconductor element 12 and the wiring board 11 due to ion migration of silver (Ag).

In the case of the bonding electrodes 14 of the wiring board 11 and the convex shaped outside connection terminals 13 which are covered with the first conductive adhesive 20-1 and to which the second conductive adhesive 20-2 is transferred, the second conductive adhesive 20-2 is not cured. Accordingly, as the load from the absorbing tool 32 is applied for connecting, a lower side part of the second conductive adhesive 20-2 (situated at the head end of the convex shaped outside connection terminals 13) is moved outside. When the applied load exceeds the designated load, as shown in FIG. 10(g), a lower surface of the first conductive adhesive 20-1, namely the surface to be connected to the bonding electrodes 14 of the wiring board 11 in the following step, is exposed in a state where the first conductive adhesive 20-1 is surrounded by the second conductive adhesive 20-2. Here, FIG. 10(g) is a view of the conductive adhesive 20 shown in FIG. 9(f) seen from an upper surface side of the bonding electrodes 14, namely the surface where the bonding electrodes 14 are connected to the conductive adhesive 20.

Thus, in the second conductive adhesive 20-2, tin (Sn) or a mixture (intermetallic compound) or an alloy whose main ingredient is tin (Sn) is dispersed as a conductive filler in the binder resin. In addition, as the first conductive adhesive 20-1, an adhesive is used where silver (Ag) or a mixture (intermetallic compound) or an alloy whose main ingredient is silver (Ag) is dispersed as a conductive filler in the binder resin. Silver (Ag) has a low volume resistivity and low contact resistance with gold (Au) forming the convex shaped outside connection terminal 13 of the semiconductor element 12. Even if the volume resistivity of the second conductive adhesive 20-2 is high, the first conductive adhesive 20-1 is exposed in substantially the center of the surface connecting to the bonding electrodes 14 of the wiring board 11. Accordingly, in a following step of connecting the semiconductor element 12 to the wiring board 11, it is possible to securely achieve electrical conductivity between the convex shaped outside connection terminals 13 of the semiconductor element 12 and the bonding electrode 14 of the wiring board 11.

After that, as shown in FIG. 10(h), the paste underfill material 17 is applied between the semiconductor element 12 and the wiring board 11 mounted and fixed on the bonding stage 31 by the dispenser 37. As the underfill material 17, epoxy resin, polyimide resin, acrylic resin, silicon resin, or another thermosetting insulation resin may be used. Conductive particles made of silver (Ag), solder or nickel (Ni) may be includes in the underfill material 17.

The inventor of the present invention supplied E-1206 made by Emerson & Cuming as the underfill material 17 between the wiring board 11 and the semiconductor element 12, heated this in the oven under the nitrogen ($N_2$) atmosphere at 150° C. for one hour so that the underfill material 17 was cured.

Thus, the semiconductor element 12 is mounted and fixed on the main surface of the wiring board 11 by a flip-chip (face down) method. Furthermore, at least the projection part of the convex shaped outside connection terminals 13 of the semiconductor element 12 and the bonding electrode 14 on the wiring board 11 corresponding to the projection parts are commonly covered with the conductive adhesive 20 having the above-mentioned two-layer structure. Thus, at least the projection part of the convex shaped outside connection terminals 13 and the bonding electrodes 14 are mechanically and electrically connected to each other. After that, the semiconductor element is released by the absorbing tool 32 and the absorbing tool 32 rises.

Then, outside connecting electrodes 15 such as solder balls made of tin (Sn)—silver (Ag) solder or tin (Sn)—silver (Ag)—copper (Cu) are provided in a grid manner on the rear surface of the wiring board 11 which is a surface situated opposite to the surface where plural semiconductor elements 12 are mounted.

After that, the wiring board 11 is cut into plural parts where the semiconductor elements 12 are mounted by using a dicing blade or the like. As a result of this, the semiconductor device 10 where the semiconductor element 12 is flip-chip mounted on the wiring board 11 is formed.

If a sealing process is necessary for the semiconductor element 12, for example, before the wiring board 11 is cut into pieces, a resin sealing process is performed to the surface of the wiring board 11 where the semiconductor element 12 is mounted. After the resin sealing process is performed, the wiring board 11 and the sealing resin part are cut in the thickness direction into parts where the semiconductor elements 12 are mounted. Thus, the semiconductor devices which are sealed by resin and cut can be formed.

Thus, the adhesive 20 is provided in the semiconductor device 10 formed by the above-discussed manufacturing method. The adhesive 20 has a two-layer structure where the second conductive adhesive 20-2 is formed outside the first conductive adhesive 20-1 so as to cover the external circumferential surface of the first conductive adhesive 20-1. The first conductive adhesive 20-1 is exposed on the surface where the conductive adhesive 20 is connected to the bonding electrodes 14 of the wiring board 11. Accordingly, it is possible to securely achieve conductivity between the convex shaped outside connection terminals 13 of the semiconductor element 12 and the bonding electrodes 14 of the wiring board 11.

In addition, by the oxide film of tin (Sn) formed on the external surface of the second conductive adhesive 20-2, it is possible to prevent hydroxide ion ($OH^-$) supplied from the wiring board 11 or the underfill material 17 from being taken into the first conductive adhesive 20-1 too much. Therefore, it is possible to prevent dendrite formation causing the ion migration and prevent shorts between the semiconductor element 12 and the wiring board 11 due to ion migration of silver (Ag).

Accordingly, it is possible to secure high reliability of the semiconductor device even if narrow pitch connection of the convex shaped outside connection terminals of the semiconductor element cannot be avoided. Hence, the embodiment of the present invention can contribute to high functionality of the electronic apparatus where the semiconductor device is mounted.

According to the test performed by the inventor of the present invention, in the semiconductor device manufactured by the manufacturing method of the embodiment of the present invention, it was recognized that insulation resistance after 1000 hours passed was equal to or greater than $1 \times 10^{10} \Omega$, the ion migration of silver (Ag) was prevented, and high reliability of the semiconductor device was secured.

Heating conditions such as heating temperature in the present invention are not limited to the above-discussed example. The heating conditions such as heating temperature are properly determined based on materials of the first conductive adhesive 20-1 and the second conductive adhesive 20-2.

Although the invention has been described with respect to specific embodiment for a complete and clear disclosure, the appended claims are not to be thus limited but are to be construed as embodying all modifications and alternative constructions that may occur to one skilled in the art that fairly fall within the basic teachings herein set forth.

This patent application is based on Japanese Priority Patent Application No. 2007-52788 filed on Mar. 2, 2007, the entire contents of which are hereby incorporated by reference.

What is claimed is:

1. A manufacturing method of a semiconductor device, comprising:
    forming a first conductive adhesive containing a conductive filler including silver (Ag) on an outside connection terminal of a semiconductor element;
    forming a second conductive adhesive on a surface of the first conductive adhesive, the second conductive adhesive containing a conductive filler including a metal selected from a group consisting of tin (Sn), zinc (Zn), cobalt (Co), iron (Fe), palladium (Pd), and platinum (Pt); and
    connecting the outside connection terminal of the semiconductor element to an electrode formed on a wiring board via a conductive adhesive composed of the first conductive adhesive and the second conductive adhesive.

2. The manufacturing method of the semiconductor device as claimed in claim 1, further comprising:
    curing the first conductive adhesive after forming the first conductive adhesive.

3. The manufacturing method of the semiconductor device as claimed in claim 1, further comprising:
    curing the second conductive adhesive after forming the second conductive adhesive.

4. The manufacturing method of the semiconductor device as claimed in claim 3,
    wherein the second conductive adhesive is cured while a force is applied by a leveling process.

5. The manufacturing method of the semiconductor device as claimed in claim 1, further comprising:
    supplying an underfill material on the wiring board before connecting the outside connection terminal of the semiconductor element to the electrode formed on the wiring board.

6. The manufacturing method of the semiconductor device as claimed in claim 1, further comprising:
    supplying an underfill material to a gap between the semiconductor element and the wiring board after connecting the outside connection terminal of the semiconductor element to the electrode formed on the wiring board.

7. The manufacturing method of the semiconductor device as claimed in claim 1,
    wherein the connecting the outside connection terminal of the semiconductor element to the electrode formed on the wiring board is performed with heating;
    an oxide film of a metal contained in the second conductive adhesive is formed on an external surface of the second conductive adhesive in the heating.

8. The manufacturing method of the semiconductor device as claimed in claim 1,
    wherein the conductive filler of the first conductive adhesive is silver (Ag) or a mixture or an alloy containing silver (Ag).

9. The manufacturing method of the semiconductor device as claimed in claim 1,
    wherein the conductive filler of the second conductive adhesive is tin (Sn) or a mixture or an alloy containing tin (Sn).

10. The manufacturing method of the semiconductor device as claimed in claim 1,
    wherein the second conductive adhesive further contains resin.

11. The manufacturing method of the semiconductor device as claimed in claim 10,
    wherein the resin is made of a material selected from a group consisting of an epoxy composition, an acrylic composition, a vinyl composition, and a thermosetting composition.

12. The manufacturing method of the semiconductor device as claimed in claim 5,
    wherein the underfill material is made of a material selected from a group consisting of epoxy resin, polyimide resin, acrylic resin, and silicon resin.

* * * * *